(12) United States Patent
Kurihara et al.

(10) Patent No.: US 8,723,374 B2
(45) Date of Patent: May 13, 2014

(54) NON-CONTACT POWER RECEIVING APPARATUS

(75) Inventors: Takeshi Kurihara, Kyoto-fu (JP); Keiichi Ichikawa, Kyoto-fu (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 464 days.

(21) Appl. No.: 13/194,383

(22) Filed: Jul. 29, 2011

(65) Prior Publication Data
US 2011/0278951 A1 Nov. 17, 2011

Related U.S. Application Data

(63) Continuation of application No. PCT/JP2010/050932, filed on Jan. 26, 2010.

(30) Foreign Application Priority Data

Jan. 30, 2009 (JP) ................... 2009-019963

(51) Int. Cl.
*G05F 3/06* (2006.01)
(52) U.S. Cl.
USPC .......................................... 307/151
(58) Field of Classification Search
USPC .......................................... 307/151
See application file for complete search history.

(56) References Cited

FOREIGN PATENT DOCUMENTS

| JP | 62-176112 A | 8/1987 |
|----|----|----|
| JP | 07-105808 A | 4/1995 |
| JP | 09-307273 A | 11/1997 |
| JP | 2000-092753 A | 3/2000 |
| JP | 2001-015867 A | 1/2001 |
| JP | 2002-010535 A | 1/2002 |
| JP | 2003-060351 A | 2/2003 |
| JP | 2007-151123 A | 6/2007 |

OTHER PUBLICATIONS

International Search Report; PCT/JP2010/050932; Apr. 27, 2010.
Written Opinion of the International Searching Authority; PCT/JP2010/050932; Apr. 27, 2010.

*Primary Examiner* — Robert L. Deberadinis
(74) *Attorney, Agent, or Firm* — Studebaker & Brackett PC

(57) ABSTRACT

The disclosure provides a non-contact power receiving apparatus including a conductive pattern in a second region of a substrate not covered by a magnetic sheet. The conductive pattern includes first and second electrodes provided in a first plane parallel to a surface of the substrate and arranged in a length direction of the conductive pattern. A third electrode is formed on a second plane parallel with the first plane. A first via hole connects superposed portions of the first and third electrodes to each other, and a second via hole connects superposed portions of the second and third electrodes to each other. As a result, loops of eddy currents generated in the conductive pattern can be made to be small, whereby eddy current loss can be reduced.

13 Claims, 4 Drawing Sheets

NON-CONTACT POWER RECEIVING APPARATUS

CROSS REFERENCE TO RELATED APPLICATIONS

The present application is a continuation of International Application No. PCT/JP2010/050932 filed Jan. 26, 2010, which claims priority to Japanese Patent Application No. 2009-019963 filed Jan. 30, 2009, the entire contents of each of these applications being incorporated herein by reference in their entirety.

TECHNICAL FIELD

The present invention relates to non-contact power receiving apparatuses, and in particular to a non-contact power receiving apparatus that is arranged so as to face the power transmission coil of a power transmitting apparatus and receive power in a non-contact manner from the power transmitting apparatus.

BACKGROUND

To date, non-contact power transmission systems have been developed in which power is transmitted using electromagnetic induction in a non-contact manner. In such a power transmission system, when a power receiving apparatus is arranged in such a manner as to face the power transmission coil of a power transmitting apparatus, the power transmitting coil of the power transmitting apparatus and the power receiving coil of the power receiving apparatus are coupled to each other through electromagnetic induction, whereby AC power is transmitted from the power transmitting apparatus to the power receiving apparatus in a non-contact manner. AC power transmitted to the power receiving apparatus is converted into DC power by a power converter circuit provided in the power receiving apparatus, and the DC power is supplied to a load (refer to Japanese Unexamined Patent Application Publication No. 2002-10535, for example).

SUMMARY

In an aspect of the disclosure, a non-contact power receiving apparatus is adapted to receive power from a power transmitting apparatus in a non-contact manner with the non contact power receiving apparatus arranged to face a power transmitting coil of the power transmitting apparatus. The non-contact power receiving apparatus includes a power receiving coil electromagnetically couplable to the power transmitting coil to receive AC power from the power transmitting apparatus, a power converter circuit connected to the power receiving coil and adapted to convert the AC power into DC power, and a substrate on which the power receiving coil and the power converter circuit are mounted. A conductive pattern of the power converter circuit includes first and second electrodes in a first plane parallel with a surface of the substrate and arranged in a length direction of the conductive pattern, and a third electrode in a second plane parallel with the first plane. The first and third electrodes are partly superposed with each other when viewed from a direction perpendicular to the front surface of the substrate. The second and third electrodes are partly superposed with each other when viewed from the direction perpendicular to the front surface of the substrate. The conductive pattern of the power converter circuit further includes a first via hole at a superposed portion of the first and third electrodes and that connects the first and third electrodes to each other, and a second via hole at a superposed portion of the second and third electrodes and that connects the second and third electrodes to each other.

In a more specific embodiment of the disclosure, the first via hole may be provided in a plurality, and the second via hole may be provided in a plurality.

In another more specific embodiment, the first plane may be a front surface of the substrate, and the second plane may be a back surface of the substrate.

In yet another more specific embodiment, the substrate may be a multilayer substrate, and the first plane may be a plane of one layer of a plurality of layers of the multilayer substrate, and the second plane may be a plane of another layer of the plurality of layers.

In another aspect of the disclosure, a non-contact power receiving apparatus is adapted to receive power from a power transmitting apparatus in a non-contact manner with the non contact power receiving apparatus arranged to face a power transmitting coil of the power transmitting apparatus. The non-contact power receiving apparatus includes a power receiving coil electromagnetically couplable to the power transmitting coil to receive AC power from the power transmitting apparatus, a power converter circuit connected to the power receiving coil and adapted to convert the AC power into DC power, and a substrate on which the power receiving coil and the power converter circuit are mounted. A conductive pattern of the power converter circuit includes a plurality of electrodes arranged in a length direction of the conductive pattern and an electronic component connected between neighboring ones of the plurality of electrodes.

In a more specific embodiment, the electronic component may include a resistor.

In another more specific embodiment, the electronic component may include an inductor.

In still another more specific embodiment, the electronic component may include a capacitor and an inductor connected in parallel with each other.

In yet another more specific embodiment, the non-contact power receiving apparatus may further include a magnetic sheet between the power receiving coil and the substrate, which is adapted to decreases leakage of magnetic flux of the power receiving coil. The magnetic sheet may be provided so as to cover a first region of the front surface of the substrate, and at least part of the power converter circuit may be mounted in a second region of the front surface of the substrate, the second region being not covered by the magnetic sheet.

In another more specific embodiment, the power converter circuit may include a rectifier circuit adapted to rectify an output voltage between terminals of the power receiving coil, and a smoothing capacitor that smoothes an output voltage of the rectifier circuit. The smoothing capacitor may be mounted in the second region.

Other features, elements, and characteristics, and advantages will become more apparent from the following detailed description with reference to the attached drawings.

DETAILED DESCRIPTION

Existing power transmission systems have a problem in that power transmission efficiency is low. Embodiments according to the present disclosure can provide a non-contact power transmission system in which the power transmission efficiency is increased.

Figure 1:
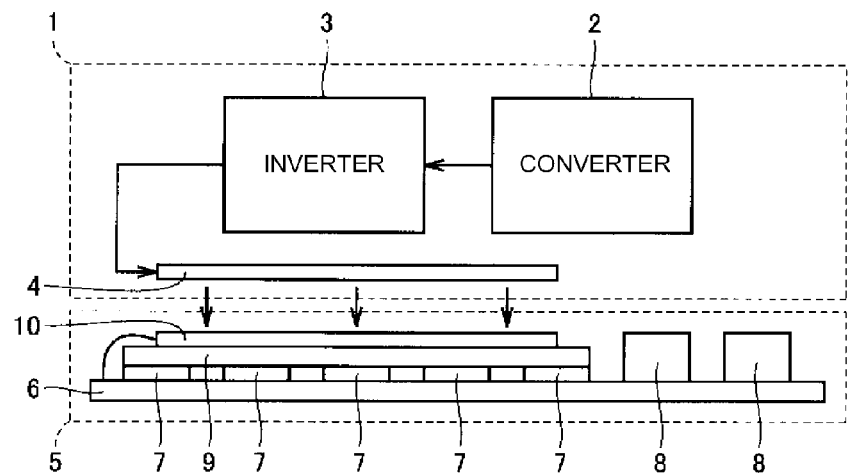
FIG. 1 is a block diagram illustrating a configuration of a non-contact power transmission system according to an exemplary embodiment.

FIG. 1 is a block diagram illustrating a configuration of a non-contact power transmission system according to an exemplary embodiment. Referring to FIG. 1, the non-contact power transmission system includes a non-contact power transmitting apparatus 1 and a non-contact power receiving apparatus 5.

The non-contact power transmitting apparatus 1 includes a converter 2, an inverter 3, and a power transmitting coil 4. The converter 2 converts commercial AC power into DC power. The inverter 3 converts the DC power into AC power having a predetermined frequency (for example, 100 KHz) and supplies it to the power transmitting coil 4.

The power receiving apparatus 5 includes a substrate 6, a plurality of electronic components 7 and 8, a magnetic sheet 9, and a power receiving coil 10. A power converter circuit which converts AC power received by the power receiving coil 10 into DC power is formed on the front surface of the substrate 6. The power converter circuit is formed of the various electronic components 7 and 8. The various electronic components 7 and 8 are grouped into relatively short electronic components 7 and relatively tall electronic components 8.

The front surface of the substrate 6 is divided into a first region and a second region. A plurality of the short electronic components 7 are arranged in the first region, and a plurality of the tall electronic components 8 are arranged in the second region. The magnetic sheet 9 is arranged so as to cover the first region, and the power receiving coil 10 is provided on the magnetic sheet 9. The power receiving coil 10 is connected to the power converter circuit on the substrate 6. As can be seen from FIG. 1, by arranging the electronic components 7, the magnetic sheet 9, and the power receiving coil 10 in the first region, and arranging the electronic components 8 in the second region, the height of the power receiving apparatus 5 can be kept small.

Referring to FIG. 1, when the power receiving coil 10 of the power receiving apparatus 5 is arranged so as to face the power transmitting coil 4 of the power transmitting apparatus 1, the power transmitting coil 4 and the power receiving coil 10 are coupled through electromagnetic induction and AC power is transmitted from the power transmitting apparatus 1 to the power receiving apparatus 5. The power converter circuit of the power receiving apparatus 5 converts this AC power into DC power, which charges a battery (not illustrated).

Figure 2:
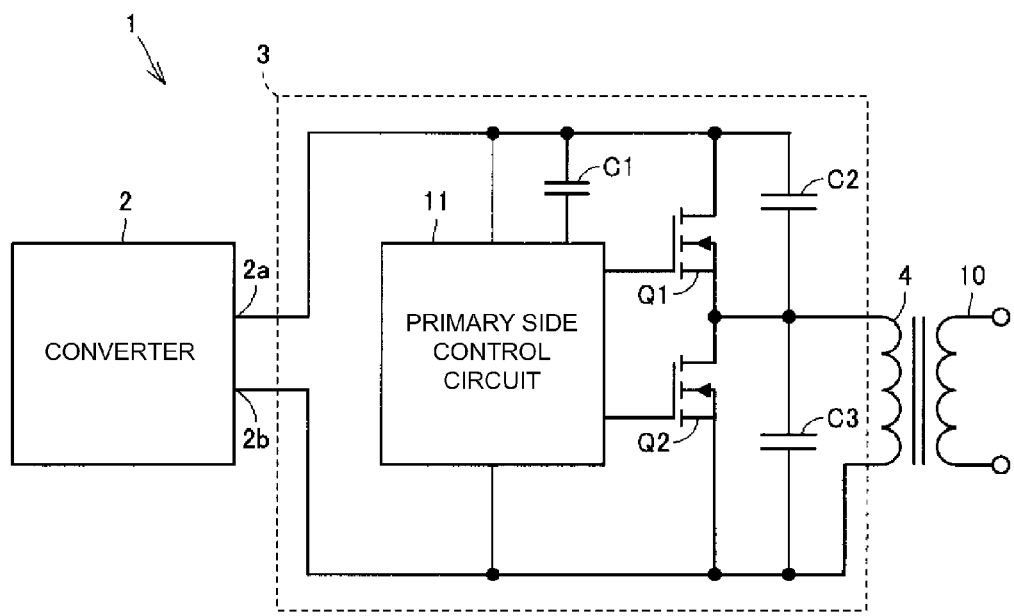
FIG. 2 is a circuit block diagram illustrating a configuration of a power transmitting apparatus illustrated in FIG. 1.
Figure 3:
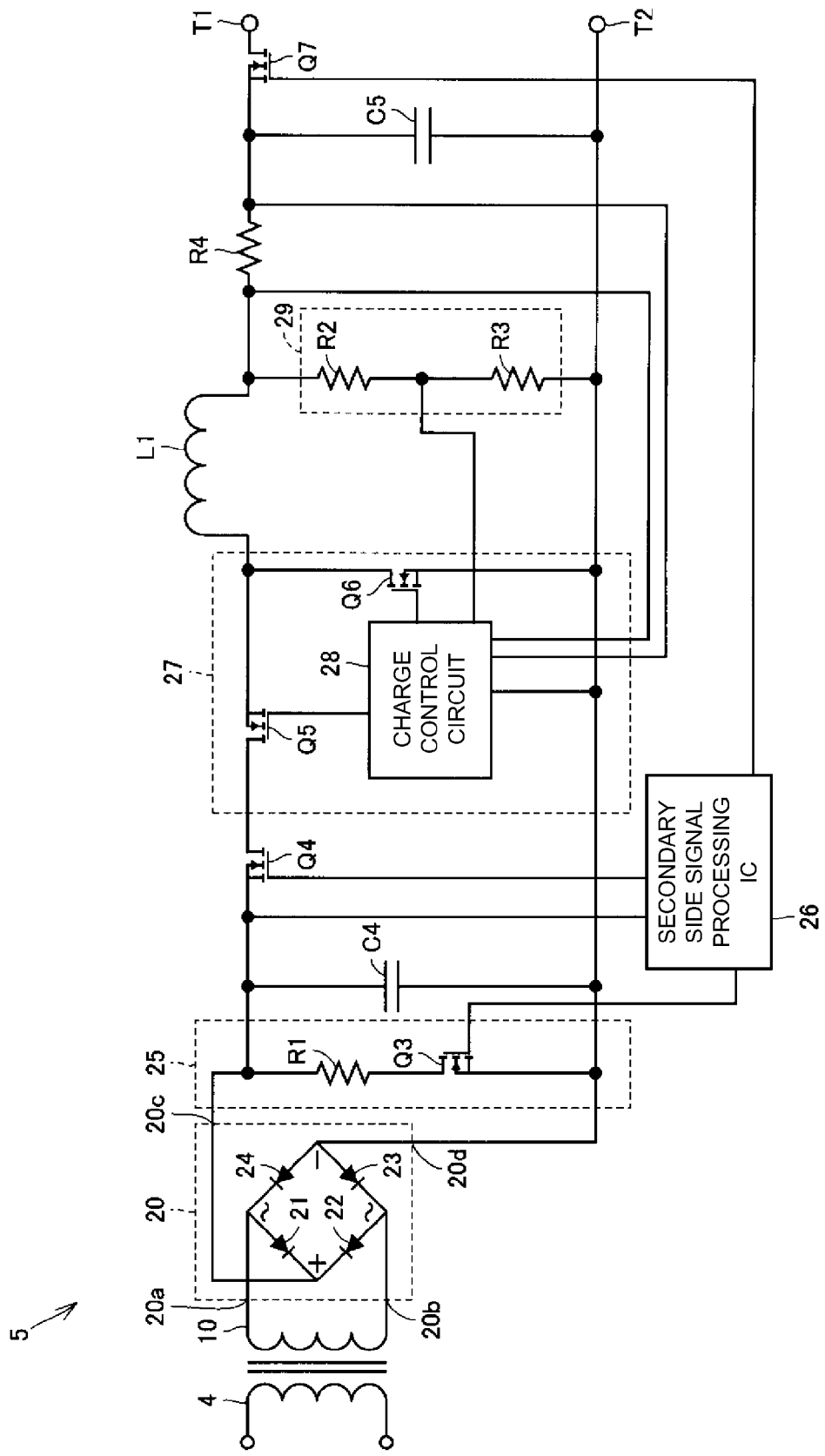
FIG. 3 is a circuit diagram illustrating a configuration of a power receiving apparatus illustrated in FIG. 1.

FIG. 2 is a circuit block diagram illustrating a configuration of the power transmitting apparatus 1, and FIG. 3 is a circuit diagram illustrating a configuration of the power converter circuit of the power receiving apparatus 5. Referring to FIGS. 2 and 3, the power transmitting coil 4 and the power receiving coil 10 are arranged so as to face each other and are coupled to each other through electromagnetic induction and form a transformer. A DC voltage is output between output terminals 2a and 2b of the converter 2 of the power transmitting apparatus 1. The inverter 3 includes a primary side control circuit 11, capacitors C1 to C3, and re-channel MOS transistors Q1 and Q2. The transistors Q1 and Q2 are connected in series between the output terminals 2a and 2b of the converter 2. The capacitors C2 and C3 are respectively connected in parallel with the transistors Q1 and Q2. The power transmitting coil 4 is connected in parallel with the transistor Q2.

The primary side control circuit 11, in accordance with the power receiving apparatus 5 that is arranged so as to face the power transmitting coil 4, transmits a signal to the power receiving apparatus 5 by turning on/off the transistors Q1 and Q2 at predetermined timings, and inquires whether or not the power receiving apparatus 5 is an apparatus that has been registered in advance. When the power receiving apparatus 5 sends back a signal indicating that the apparatus is an apparatus that has been registered in advance, the primary side control circuit 11 transmits power by alternately turning on/off the transistors Q1 and Q2. When the transistors Q1 and Q2 are alternately turned on/off, an AC voltage is generated at the power transmitting coil 4, and the AC voltage is transmitted to the power receiving coil 10. The reason why an inquiry is made as to whether or not the apparatus has been registered in advance before starting to transmit power in this manner is to prevent transmission of power when an apparatus other than the power receiving apparatus 5 has been arranged so as to face the power transmitting coil 4.

Referring to FIG. 3, the power receiving apparatus 5 includes, other than the power receiving coil 10, diodes 21 to 24, resistors R1 to R4, n-channel MOS transistors Q3 to Q7, capacitors C4 and C5, an inductor L1, a secondary side signal processing IC 26, and a charge control circuit 28.

The diodes 21 to 24 form a rectifier circuit 20. The power receiving coil 10 is connected between input terminals 20a and 20b of the rectifier circuit 20. The rectifier circuit 20 performs full-wave rectification for an AC voltage generated between the terminals of the power receiving coil 10. The capacitor C4 is connected between a positive output terminal 20c and a negative output terminal 20d of the rectifier circuit 20. The output voltage of the rectifier circuit 20 is smoothed by the capacitor C4 and becomes a DC voltage. The resistor R1 and the transistor Q3, which are connected in series between the output terminals 20c and 20d, form a load modulation circuit 25. The transistors Q4 and Q5, the inductor L1, the resistor R4, and the transistor Q7 are connected in series between the output terminal 20c of the rectifier circuit 20 and an output terminal T1 of the power receiving apparatus 5. The output terminal 20d of the rectifier circuit 20 is connected to an output terminal T2 of the power receiving apparatus 5.

The secondary side signal processing IC 26 is connected to the output terminal 20c of the rectifier circuit 20 and the gates of the transistors Q3, Q4, and Q7. In the initial state, the transistors Q3, Q4, and Q7 are turned off. When a signal for inquiring whether or not the power receiving apparatus is an apparatus that has been registered in advance is sent from the power transmitting apparatus 1, the secondary side signal processing IC 26 transmits a signal indicating that the power receiving apparatus is an apparatus that has been registered in advance by turning on/off the transistor Q3 at predetermined timings. Further, when power transmission from the power transmitting apparatus 1 has been started, the secondary side signal processing IC 26 turns off the transistor Q3 and turns on the transistors Q4 and Q7.

The transistors Q5 and Q6, and the charge control circuit 28 form a DC/DC converter IC 27. The transistor Q6 is connected to one terminal (node between the transistor Q5 and the inductor L1) of the inductor L1 and the output terminal T2. The resistors R2 and R3, which are connected in series between the other terminal of the inductor L1 and the output terminal T2, form an output voltage detecting circuit 29. The output voltage of the power receiving apparatus 5 is divided by the resistors R2 and R3 and the divided voltage is applied to the charge control circuit 28. The output current of the power receiving apparatus 5 is converted by the resistor R4 into a voltage, which is applied to the charge control circuit 28.

The charge control circuit 28, on the basis of the detection results of the output voltage detecting circuit 29 and a voltage across the resistor R4, alternately turns on the transistors Q5 and Q6 so as to make the output voltage of the power receiving apparatus 5 a predetermined voltage and make the output current of the power receiving apparatus 5 constant. The capacitor C5, which is connected between the output terminal T2 and a node between the resistor R4 and the transistor Q7, smoothes the output voltage of the power receiving apparatus 5. Thereby, a constant DC current flows between the output terminals T1 and T2. The output terminals T1 and T2 are connected to a battery of, for example, a mobile terminal apparatus.

Figure 4:
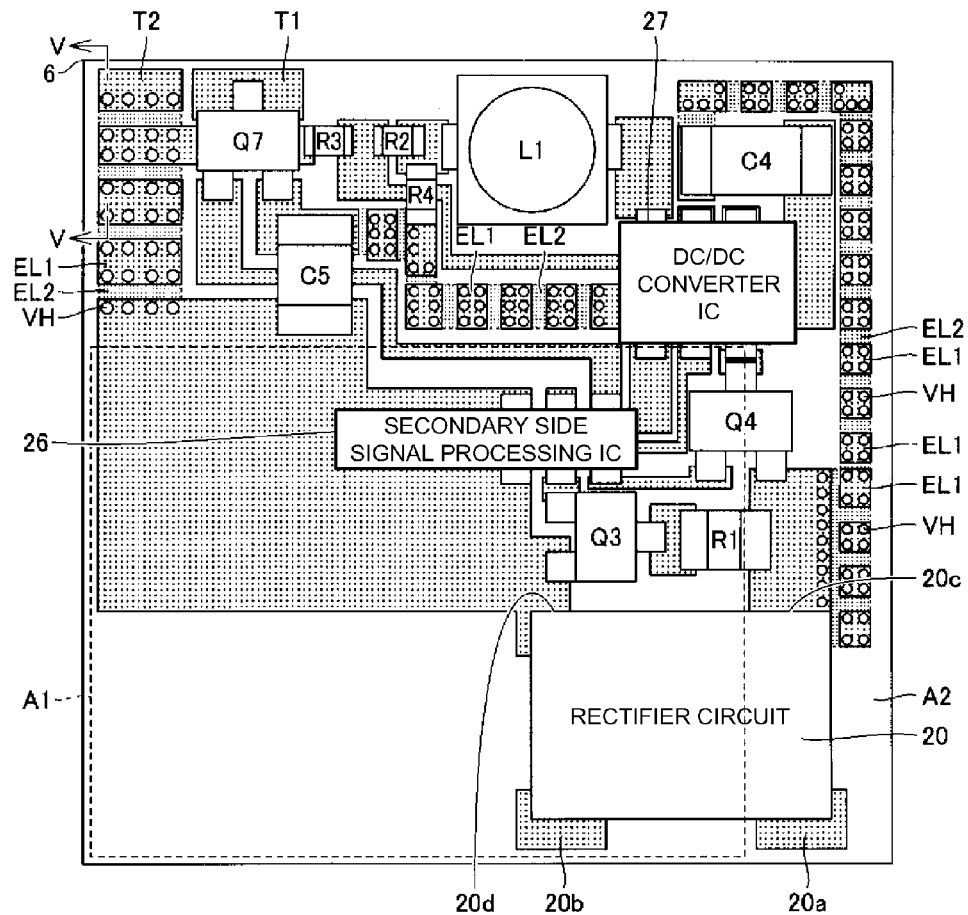
FIG. 4 illustrates a layout of a power converter circuit formed on the front surface of a substrate illustrated in FIG. 1.
Figure 5:
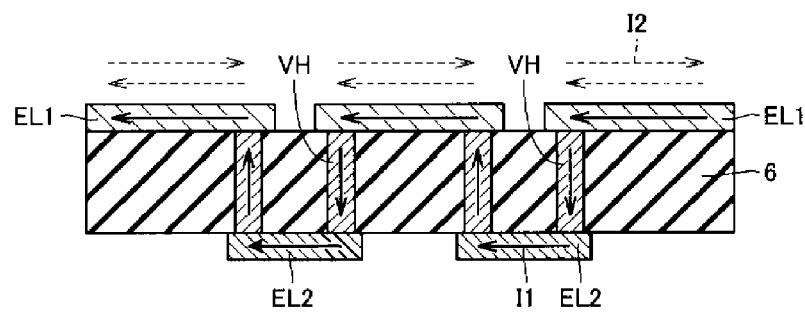
FIG. 5 is a sectional view taken along the line V-V in FIG. 4.

FIG. 4 illustrates a layout of the power converter circuit formed on the front surface of the substrate 6 of the power receiving apparatus 5, and FIG. 5 is a sectional view taken along the line V-V in FIG. 4. In FIGS. 4 and 5, the first region A1 surrounded by a broken line in the lower left portion of the front surface of the substrate 6 in FIG. 4 is a region covered by the magnetic sheet 9 illustrated in FIG. 1. A region of the front surface of the substrate 6 other than the first region is the second region A2. The capacitors C4 and C5, the DC/DC converter IC 27, and the inductor L1 of the power receiving apparatus 5 are the relatively tall electronic components 8, and are arranged in the second region A2. The remaining rectifier circuit 20, the resistors R1 to R4, the transistors Q3 to Q7, and the secondary side signal processing IC 26 are the relatively short electronic components 7, and are distributedly arranged in the first region A1 and/or the second region A2.

Each of relatively wide and long conductive patterns, among the conductive patterns in the second region A2, is divided into a plurality of electrodes EL1 formed on the front surface of the substrate 6 arranged in the length direction of the conductive patterns and a plurality of electrodes EL2 formed on the back surface of the substrate 6 arranged in the length direction of the conductive patterns. In FIG. 4, a conductive pattern between the output terminal 20c of the rectifier circuit 20 and one terminal of the capacitor C4, a conductive pattern between the output terminal 20d of the rectifier circuit 20 and the output terminal T2 of the power receiving apparatus 5, and a conductive pattern between the DC/DC converter IC 27 and one terminal of the resistor R4 are respectively divided into a plurality of the electrodes EL1 and a plurality of the electrodes EL2.

The plurality of the electrodes EL1 and the plurality of the electrodes EL2 are alternately arranged one by one in the length direction of a conductive pattern when viewed from the direction perpendicular to the front surface of the substrate 6. Referring to FIG. 5, the electrodes EL1 and EL2 that neighbor each other are arranged so as to be partly superposed with each other when viewed from the direction perpendicular to the front surface of the substrate 6, and are connected to each other by a plurality of via holes VH. As illustrated by solid arrow lines in FIG. 5, a DC current I1 flows along a path: electrode EL1, via hole VH, electrode EL2, via hole VH, electrode EL1, . . . .

An eddy current I2 flows through each of the electrodes EL1 perpendicular to leakage magnetic flux so as to hinder a change in the leakage magnetic flux, and does not flow through the via holes VH, which are parallel with the leakage magnetic flux. As illustrated by broken arrow lines in FIG. 5, the eddy current I2 circulates only within each of the electrodes EL1. Hence, compared with the case in which a conductive pattern is not divided into a plurality of the electrodes EL1 and EL2, the area of a loop of the eddy current I2 is decreased. As a result, eddy current loss can be reduced, allowing the power transmission efficiency of a power transmission system to be increased.

In other words, when conductive patterns having existing configurations are arranged in the second region A2 which is not covered by the magnetic sheet 9, large eddy currents are generated due to leakage magnetic flux, whereas the configuration of embodiments according to the present disclosure allows eddy current loss to be decreased. Embodiments according to the disclosure have an advantage especially in the second region A2 which is not covered by the magnetic sheet 9. However, conductive patterns in the first region A1 which is covered by the magnetic sheet 9 also can be divided into the electrodes EL1 and the electrodes EL2, because leakage magnetic flux cannot be completely shielded by the magnetic sheet 9.

Further, since the electrodes EL1 and EL2 that neighbor each other are connected using a plurality of the via holes VH, eddy current loss can be decreased without restricting the main current flowing through the conductive pattern. Note that, since the eddy current I2 flows along each of the peripheral portions of the electrodes EL1 and EL2, the eddy current I2 flowing through each of the via holes VH can be decreased more with via holes VH provided within the electrodes EL1 and EL2 compared with via holes VH provided at the ends of the electrodes EL1 and EL2.

In the present exemplary embodiment, the electrodes EL1 are provided on the front surface of the substrate 6 and the electrodes EL2 are provided on the back surface. However, by using a multilayer substrate instead of the substrate 6, the electrodes EL1 may be provided on a layer among a plurality of the layers of the multilayer substrate and the electrodes EL2 may be provided on another layer.

Figure 6:
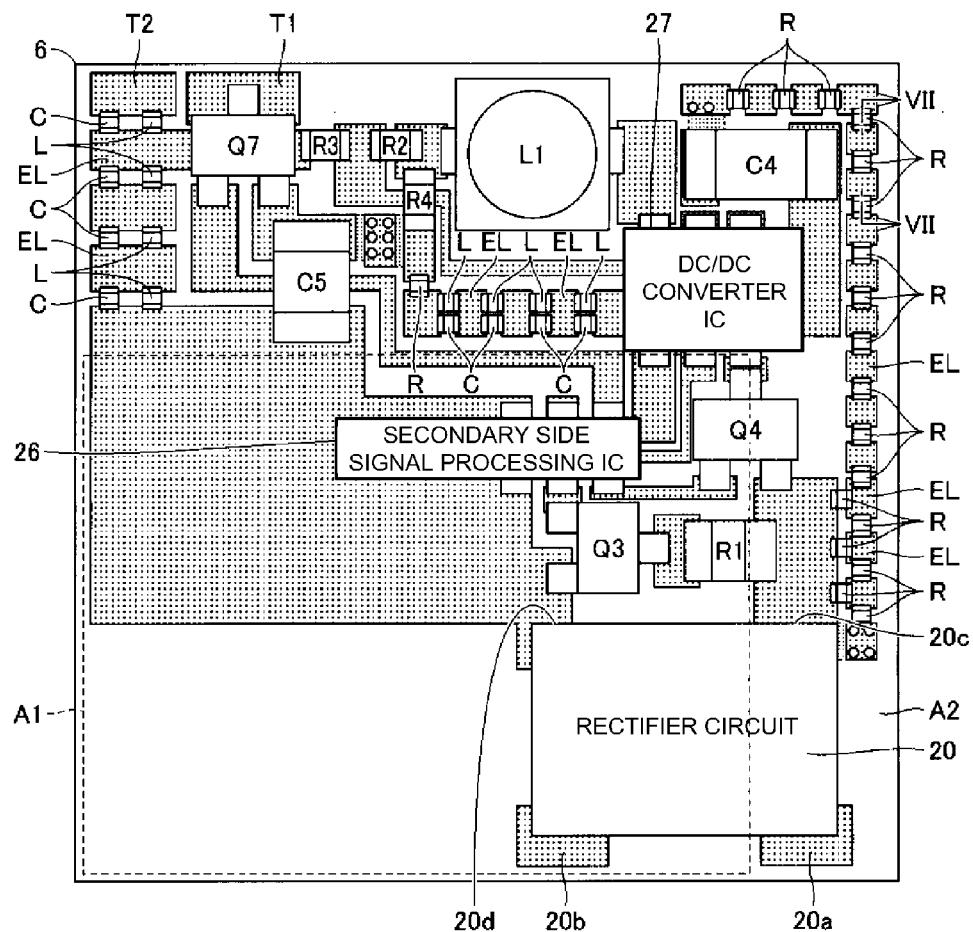
FIG. 6 illustrates an exemplary modification of the exemplary embodiment.
Figure 7:
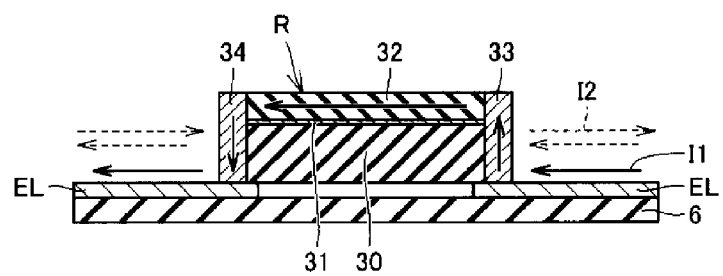
FIG. 7 is a sectional view taken along the line VII-VII in FIG. 6.

FIG. 6 illustrates an exemplary modification of the exemplary embodiment described above in comparison with FIG. 4, and FIG. 7 is a sectional view taken along the line VII-VII in FIG. 6. Referring to FIGS. 6 and 7, in this exemplary modification, at least part of relatively wide and long conductive patterns, among the conductive patterns in the second region A2, is formed on the front surface of the substrate 6, and is divided into a plurality of electrodes EL arranged at a predetermined pitch in the length direction of the conductive patterns. In FIG. 6, at least part of a conductive pattern between the output terminal 20c of the rectifier circuit 20 and one terminal of the capacitor C4 is divided into a plurality of the electrodes EL. The two electrodes EL that neighbor each other are connected to each other by a low-resistance resistor R.

Referring to FIG. 7, the low-resistance resistor R includes a substrate 30, a conductive layer 31, and an insulating layer 32 stacked on the front surface of the substrate 30, and two terminals 33 and 34 provided at the two ends of the substrate 30. The conductive layer 31 is connected between the two terminals 33 and 34. The two terminals 33 and 34 are respectively soldered to the surfaces of the two electrodes EL. As illustrated by the solid arrow lines in FIG. 7, the DC current I1 flows through a path: electrode EL, terminal 33, conductive layer 31, terminal 34, electrode EL, and so on.

The eddy current I2 flows through each of the electrodes EL perpendicular to leakage magnetic flux so as to hinder a change in the leakage magnetic flux, and does not flow through the terminals 33 and 34 which are parallel with the leakage magnetic flux. As illustrated by broken arrow lines in FIG. 7, the eddy current I2 circulates only within each of the electrodes EL. Hence, the area of a loop of the eddy current I2 is decreased, allowing eddy current loss to be reduced.

In addition, referring to FIG. 6, at least part of a conductive pattern between the output terminal 20$d$ of the rectifier circuit 20 and the output terminal T2 of the power receiving apparatus 5, and at least part of a conductive pattern between the DC/DC converter IC 27 and one terminal of the resistor R4 are divided into a plurality of the electrodes EL. An inductor L and a capacitor C are connected in parallel between the two electrodes EL that neighbor each other. Each of the inductor L and capacitor C has the terminals 33 and 34 which are parallel with leakage magnetic flux, similarly to the low-resistance resistor R. Hence, also in this case, the eddy current I2 circulates only within each of the electrodes EL, and the area of a loop of the eddy current I2 is decreased, allowing eddy current loss to be reduced.

Further, by making the resonant frequency of a parallel resonant circuit formed of the inductor L and the capacitor C the same as the frequency (for example, 1.2 MHz) of noise generated as a result of driving of the DC/DC converter IC 27, for example, noise can be removed.

Note that the resistor R may be replaced with the inductor L. In this case, as a result of the inductor L allowing a DC current to pass therethrough and cutting off an AC current, noise components can be removed.

The conductive patterns described herein and consistent with the disclosure can be applied to a non-contact power transmission apparatus. This non-contact power transmitting apparatus is a non-contact power transmitting apparatus that is arranged so as to face a power receiving coil of a power receiving apparatus. The non-contact power transmitting apparatus transmits power to the power receiving apparatus in a non-contact manner and includes a power transmitting coil that is electromagnetically coupled to the power receiving coil and transmits AC power to the power receiving apparatus, a power generator circuit that is connected to the power transmitting coil and generates AC power, and a substrate on which the power transmitting coil and the power generator circuit are mounted. A conductive pattern of the power generator circuit includes first and second electrodes that are formed in a first plane parallel with a front surface of the substrate and that are arranged in a length direction of the conductive pattern, and a third electrode formed in a second plane parallel with the first plane. The first and third electrodes are arranged so as to be partly superposed with each other when viewed from a direction perpendicular to the front surface of the substrate. The second and third electrodes are arranged so as to be partly superposed with each other when viewed from the direction perpendicular to the front surface of the substrate. The conductive pattern of the power converter circuit further includes a first via hole that is provided at a superposed portion of the first and third electrodes and that connects the first and third electrodes to each other, and a second via hole that is provided at a superposed portion of the second and third electrodes and that connects the second and third electrodes to each other.

In a non-contact power receiving apparatus according to the disclosure, since the conductive patterns of a power conversion circuit are divided into a plurality of electrodes, the loops of eddy currents generated in the conductive pattern can be made to be small. Hence, eddy current loss can be reduced and power transmission efficiency can be increased.

All embodiments disclosed above are examples, and thus should not be considered to be limiting. It is to be understood that the scope of the invention is shown by the claims and not by the above description, and includes all modifications within the meaning and the scope of the claims and their equivalents.

What is claimed is:

1. A non-contact power receiving apparatus adapted to receive power from a power transmitting apparatus in a non-contact manner with the non-contact power receiving apparatus arranged to face a power transmitting coil of the power transmitting apparatus, the non-contact power receiving apparatus comprising:
   a power receiving coil electromagnetically couplable to the power transmitting coil to receive AC power from the power transmitting apparatus;
   a power converter circuit connected to the power receiving coil and adapted to convert the AC power into DC power; and
   a substrate on which the power receiving coil and the power converter circuit are mounted,
   wherein a conductive pattern of the power converter circuit includes:
      first and second electrodes in a first plane parallel with a surface of the substrate and arranged in a length direction of the conductive pattern; and
      a third electrode in a second plane parallel with the first plane,
   wherein the first and third electrodes are partly superposed with each other when viewed from a direction perpendicular to the front surface of the substrate,
   wherein the second and third electrodes are partly superposed with each other when viewed from the direction perpendicular to the front surface of the substrate, and
   wherein the conductive pattern of the power converter circuit further includes:
      a first via hole at a superposed portion of the first and third electrodes and that connects the first and third electrodes to each other; and
      a second via hole at a superposed portion of the second and third electrodes and that connects the second and third electrodes to each other.

2. The non-contact power receiving apparatus according to claim 1,
   wherein the first via hole is provided in a plurality, and
   wherein the second via hole is provided in a plurality.

3. The non-contact power receiving apparatus according to claim 1,
   wherein the first plane is a front surface of the substrate, and
   wherein the second plane is a back surface of the substrate.

4. The non-contact power receiving apparatus according to claim 1,
   wherein the substrate is a multilayer substrate, and the first plane is a plane of one layer of a plurality of layers of the multilayer substrate, and the second plane is a plane of another layer of the plurality of layers.

5. The non-contact power receiving apparatus according to claim 1, further comprising:
   a magnetic sheet that is provided between the power receiving coil and the substrate and that decreases leakage of magnetic flux of the power receiving coil, wherein the magnetic sheet is provided so as to cover a first region of the front surface of the substrate, and wherein at least part of the power converter circuit is mounted in a second region of the front surface of the substrate, the second region being not covered by the magnetic sheet.

6. The non-contact power receiving apparatus according to claim 5, wherein the power converter circuit includes:

a rectifier circuit that rectifies an output voltage between terminals of the power receiving coil; and a smoothing capacitor that smoothes an output voltage of the rectifier circuit, and wherein the smoothing capacitor is mounted in the second region.

7. A non-contact power receiving apparatus adapted to receive power from a power transmitting apparatus in a non-contact manner with the non-contact power receiving apparatus arranged to face a power transmitting coil of the power transmitting apparatus, the non-contact power receiving apparatus comprising:

a power receiving coil electromagnetically couplable to the power transmitting coil to receive AC power from the power transmitting apparatus;

a power converter circuit connected to the power receiving coil and adapted to convert the AC power into DC power; and a substrate on which the power receiving coil and the power converter circuit are mounted, wherein a conductive pattern of the power converter circuit includes:

a plurality of electrodes arranged in a length direction of the conductive pattern; and an electronic component connected between neighboring ones of the plurality of electrodes.

8. The non-contact power receiving apparatus according to claim 7, wherein the electronic component includes a resistor.

9. The non-contact power receiving apparatus according to claim 7, wherein the electronic component includes an inductor.

10. The non-contact power receiving apparatus according to claim 7, wherein the electronic component includes a capacitor and an inductor connected in parallel with each other.

11. The non-contact power receiving apparatus according to claim 7, further comprising:

a magnetic sheet between the power receiving coil and the substrate, said magnetic sheet adapted to decrease leakage of magnetic flux of the power receiving coil, wherein the magnetic sheet covers a first region of the front surface of the substrate, and wherein at least part of the power converter circuit is mounted in a second region of the front surface of the substrate, the second region being not covered by the magnetic sheet.

12. The non-contact power receiving apparatus according to claim 11, wherein the power converter circuit includes:

a rectifier circuit adapted to rectify an output voltage between terminals of the power receiving coil; and a smoothing capacitor adapted to smooth an output voltage of the rectifier circuit, wherein the smoothing capacitor is mounted in the second region.

13. The non-contact power receiving apparatus according to claim 7, further comprising a terminal at each end of the electronic component, wherein each terminal is connected to one of the neighboring electrodes and oriented to be substantially parallel with leakage magnetic flux present with the non-contact power receiving apparatus arranged to face the power transmitting coil of the power transmitting apparatus.

* * * * *